(12) United States Patent
Wang et al.

(10) Patent No.: US 7,049,172 B2
(45) Date of Patent: May 23, 2006

(54) PACKAGING STRUCTURE AND PROCESS OF ELECTRONIC CARD

(75) Inventors: Hank Wang, Hsin Chu (TW); Sheng-Yuan Chen, Hsin Chu (TW); Hung-Tse Wang, Hsin Chu (TW)

(73) Assignee: 3 View Technology Co., Ltd., (TW)

( * ) Notice: Subject to any disclaimer, the term of this patent is extended or adjusted under 35 U.S.C. 154(b) by 0 days.

(21) Appl. No.: 10/942,769

(22) Filed: Sep. 17, 2004

(65) Prior Publication Data

US 2005/0176172 A1     Aug. 11, 2005

(30) Foreign Application Priority Data

Feb. 6, 2004     (TW) ............... 93102857 A
Feb. 6, 2004     (TW) ............... 93201736 U
Jun. 14, 2004    (TW) ............... 93209067 U

(51) Int. Cl.
*H01L 21/44* (2006.01)
*H01L 21/48* (2006.01)
*H01L 21/50* (2006.01)

(52) U.S. Cl. ............ 438/106; 438/123; 361/737

(58) Field of Classification Search ........... 438/106, 438/111, 112, 121, 123, 124; 361/737, 752, 361/753, 801
See application file for complete search history.

(56) References Cited

U.S. PATENT DOCUMENTS 5,355,837 A * 10/1994 Reyes ................ 119/161
5,397,857 A *  3/1995 Farquhar et al. ......... 174/52.1
6,337,797 B1 *  1/2002 Huang ................. 361/737

* cited by examiner

*Primary Examiner*—Phuc T. Dang
(74) *Attorney, Agent, or Firm*—Bacon & Thomas PLLC

(57) ABSTRACT

A packaging process of an electronic card is provided. Firstly, a first embedding operation is performed to embed a first metal cover into a first surface of a plastic frame. Then, a circuit board is placed on the plastic frame. Afterward, a second embedding operation is performed to embed a second metal cover into a second surface of the plastic frame. The circuit board is encapsulated into the plastic frame so as to form an electronic card package. The first metal cover, the plastic frame and the second metal cover are separately formed.

20 Claims, 9 Drawing Sheets

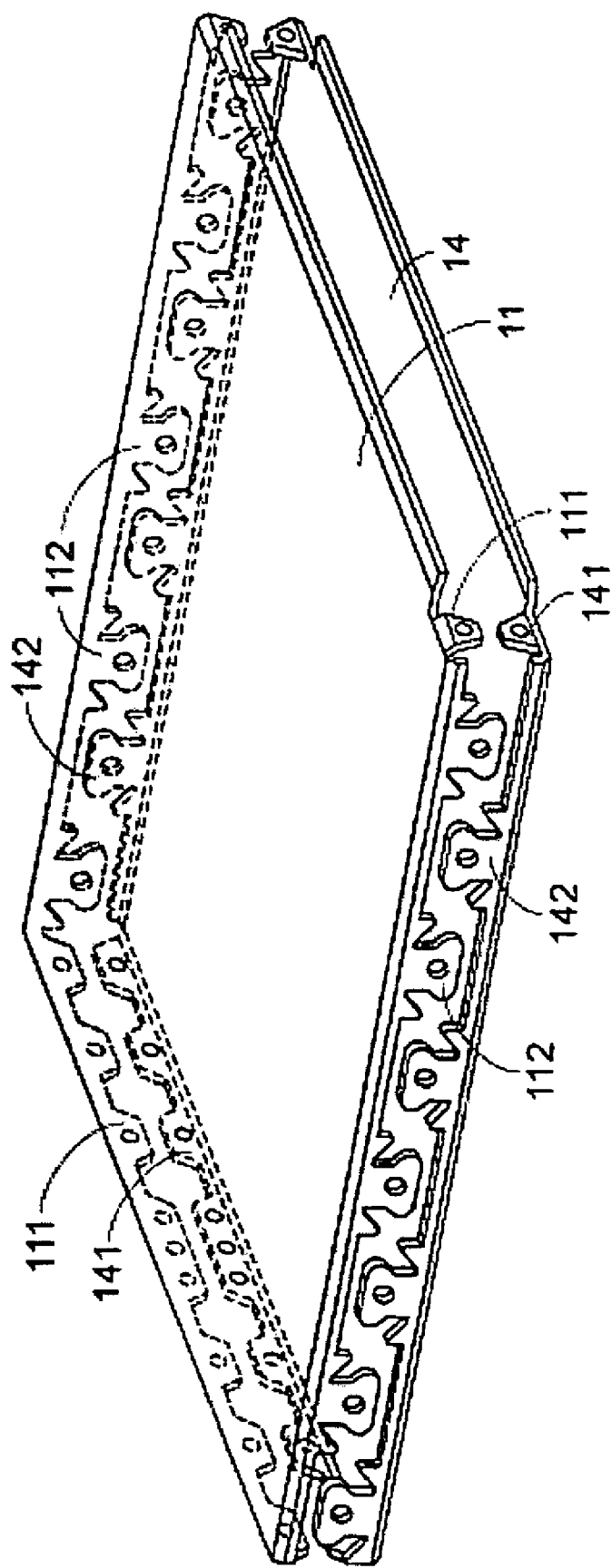

PACKAGING STRUCTURE AND PROCESS OF ELECTRONIC CARD

FIELD OF THE INVENTION

The present invention relates to an electronic card, and more particularly to a packaging structure and a packaging process of an electronic card.

BACKGROUND OF THE INVENTION

Electronic cards such as modem cards, Local Area Network cards (LAN cards) and memory cards are widely used and developed toward minimization. The common standard specifications of electronic cards comprise for example PCMCIA cards, Compact Flash cards (CF cards), secure digital cards, etc. In addition, some new standard specifications are still in development. The contents associated with these specifications are somewhat different. However, the packaging structures of these electronic cards are basically identical. Such packaging structure comprises a case for encapsulating a printed circuit board (PCB). The external surface of the case should be electrically conductive and comprises a ground terminal. After an electronic card is inserted into a slot of an electronic device, the ground terminal will be electrically connected to the system reference of the electronic device for grounding.

The packaging structure of the electronic card needs to provide sufficient mechanical strength and electrical properties, which should meet certain standards required. Moreover, it is necessary to produce these electronic cards on a large scale and with low cost. According to the conventional packaging process, a printed circuit board is firstly clamped by a plastic frame, and then a top metal cover and a bottom cover are riveted by a clamping tool. Afterward, the printed circuit board and the plastic frame are encapsulated. Since the metal covers and the plastic frame of this packaging structure are not tightly coupled, the metal covers are easily loosened or fallen off when an external force or a deflection force is exerted. Moreover, the packaging structure formed by means of riveting has poor mechanical strength, and thus results in deformation of the metal cover.

Another process for combining the metal cover with the plastic frame comprises a viscose binding process or an insert molding process. By using such process, when an external force or a deflection force is exerted on the electronic card, the bonding portions between the plastic frame and the metal cover are readily separated due to the insufficient force. Especially, when the insert molding operation is performed to combine the metal cover with the plastic frame, the required molds should be previously established. Therefore, the cost is very high. Subsequently, the metal covers and the molds are precisely aligned with each other. Afterward, plastic material is inserted into the molds so as to combine with the metal covers. Such insert molding process is time-consuming, labor-intensive and costly. The insert molding process has been described, for example, in U.S. Pat. Nos. 5,379,587, 5,475,919 and 5,490,891, and Taiwanese Patent Nos. 482305, 471673 and 549688.

SUMMARY OF THE INVENTION

It is an object of the present invention to provide a packaging structure and a packaging process of an electronic card so as to enhance the fixity between the plastic frame and the metal covers.

According to an ultrasonic welding technology or a high frequency welding technology, the metal covers are fixed onto a plastic frame, wherein the metal covers and the plastic frame are separately molded. The packaging structure provided by the present invention is more cost-effective and less time-consuming, when compared with that fabricated according to the conventional insert molding process. Since the fixity is increased, the problems of the loose packaging structure, the insufficient mechanical property and/or the fallen metal covers can be avoided.

In accordance with a first aspect of the present invention, there is provided a packaging process of an electronic card. Firstly, a first embedding operation is performed to embed a first metal cover into a first surface of a plastic frame. Then, a circuit board is placed on the plastic frame. Afterward, a second embedding operation is performed to embed a second metal cover into a second surface of the plastic frame. The circuit board is encapsulated into the plastic frame so as to form an electronic card package. The first metal cover, the plastic frame and the second metal cover are separately formed.

In an embodiment, each of the first and the second embedding operations comprises an ultrasonic welding operation or a high frequency welding operation.

In an embodiment, the plastic frame comprises a sustaining structure disposed in the vicinity of the open mouth of the plastic frame.

In an embodiment, the sustaining structure is a horizontal bar connected to lateral sides of the plastic frame.

In an embodiment, the plastic frame comprises a central receptacle for accommodating the circuit board, and the circuit board is fixed in the receptacle via the sustaining structure.

In an embodiment, the plastic frame has a rectangular shape.

In an embodiment, the plastic frame comprises a central receptacle for accommodating the circuit board.

In an embodiment, each of the first surface and the second surface of the plastic frame is provided with at least one recesses for enhancing engagement of the plastic frame with the first metal cover and the second metal cover.

In an embodiment, each of the first metal cover and the second metal cover comprises a plurality of bent pieces extending from the edges thereof, wherein each of the bent pieces has an opening.

In an embodiment, the bent pieces of the first metal cover and the second metal cover are arranged in a staggered form.

In accordance with a second aspect of the present invention, there is provided a packaging structure of an electronic card. The packaging structure comprises a plastic frame, a first metal cover and a second metal cover. The first metal cover has a plurality of first bent pieces extending from the edges thereof. The second metal cover has a plurality of second bent pieces extending from the edges thereof. The first metal cover, the plastic frame and the second metal cover are separately formed, and the first metal cover and the second metal cover are embedded into the top surface and the bottom surface of the plastic frame according to an embedding operation so as to form an electronic card package.

In accordance with a third aspect of the present invention, there is provided a packaging structure of an electronic card. The packaging structure comprises a plastic frame having blocks disposed on a inner brink surface of said plastic frame; a first metal cover having a plurality of first bent pieces extending from the edges thereof, wherein said first bent piece has a opening for receiving said block in one side of said plastic frame; and a second metal cover having a plurality of second bent pieces extending from the edges thereof, wherein said openings of said first metal cover receive said blocks of said plastic frame to fix said first metal cover on one surface of said plastic frame and said second metal cover is embedded into another surface of said plastic frame according to an embedding operation so as to form an electronic card package.

The above objects and advantages of the present invention will become more readily apparent to those ordinarily skilled in the art after reviewing the following detailed description and accompanying drawings, in which:

BRIEF DESCRIPTION OF THE DRAWINGS

FIG. 1(b) is an assembling view illustrating the top metal cover and. the bottom cover in FIG. 1(a);

DETAILED DESCRIPTION OF THE PREFERRED EMBODIMENT

Figure 1A:
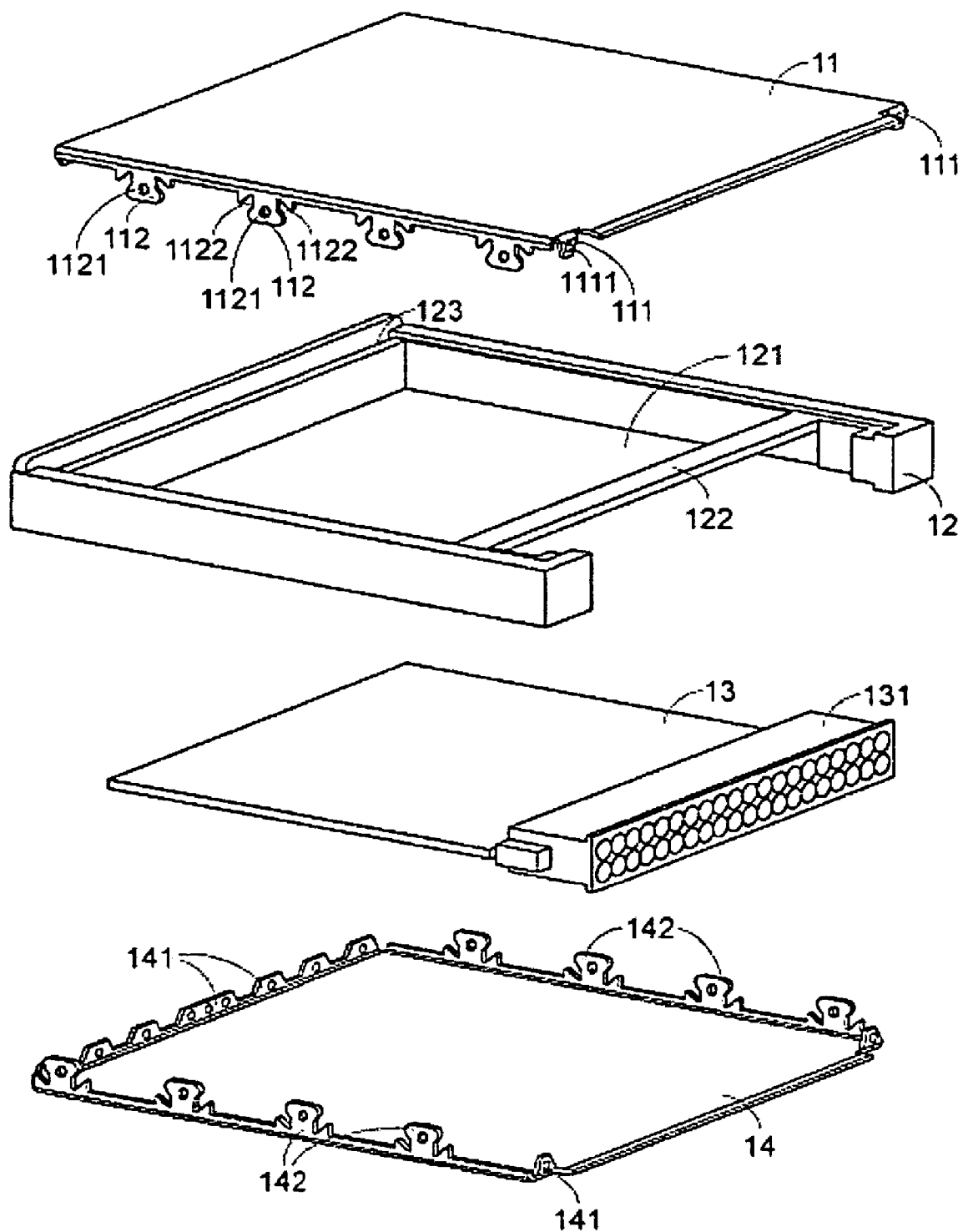
FIG. 1(a) is an exploded view illustrating a packaging structure of an electronic card according to a first embodiment of the present invention.

Referring to FIG. 1(a), an exploded view illustrating a packaging structure of an electronic card according to a first embodiment of the present invention is shown. According to an ultrasonic welding technology or a high frequency welding technology, this packaging structure is formed by fixing two metal covers into a plastic frame. Specially, the metal covers and the plastic frame are separately molded. The packaging structure comprises a first metal cover 11, a plastic frame 12, a circuit board 13 and a second metal cover 14. The circuit board 13 is preferably a printed circuit board.

The first metal cover 11 is disposed on the top surface of the plastic frame 12, and the edges of the first metal cover 11 comprise a plurality of bent pieces 111 and 112. These bent pieces 111 and 112 are coupled with the plastic frame 12 by an ultrasonic welding technology or a hot-pressing technology. Each of the bent pieces 111 has a hole 1111 in the center thereof. By using the ultrasonic welding technology, the molten plastic material of the plastic frame 12 will penetrate through the hole 1111 of the bent pieces 111, and then the first metal cover 11 is coupled with the plastic frame 12. Each of the bent pieces 112 has a hole 1121 in the center thereof and two notches 1122 on the lateral sides thereof. Likewise, by using the ultrasonic welding technology, the molten plastic material of the plastic frame 12 will penetrate through the holes 1121 and the notches 1122 so as to enhance the fixity between the first metal cover 11 and the plastic frame 12. Since the fixity is increased, the problems of the loose packaging structure, the insufficient mechanical property and/or the fallen metal covers can be avoided.

The second metal cover 14 is disposed on the bottom surface of the plastic frame 12, and the edges of the second metal cover 14 comprise a plurality of bent pieces 141 and 142. These bent pieces 141 and 142 are coupled with the plastic frame 12 by an ultrasonic welding technology or a hot-pressing technology. The bent pieces 141 and 142 have the similar structures as those of the bent pieces 111 and 112, respectively, which are not to be described redundantly herein.

Referring to FIG. 1(b), an assembling view illustrating the top metal cover and the bottom cover in FIG. 1(a) is shown. As shown, the first metal cover 11 and the second metal cover 14 are engaged with each other, wherein the bent pieces 111 of the first metal cover 11 and the bent pieces 141 of the second metal cover 14 are arranged symmetrically, and the bent pieces 112 of the first metal cover 11 and the bent pieces 142 of the second metal cover 14 are arranged in a staggered form. In such configuration, the height of the electronic card is shortened, and the undesired electromagnetic interference (EMI) is also prevented at the same time. The first metal cover 11 and the second metal cover 14 are preferably made of metal or stainless steel.

Please also refer to FIG. 1(a). The plastic frame 12 comprises a central receptacle 121 and a sustaining structure 122. The sustaining structure 122 is a horizontal bar connected to lateral sides of the plastic frame 12 and in the vicinity of the open mouth of the plastic frame 12. The receptacle 121 is utilized to accommodate the circuit board 13 and the connector 131 to be electrically connected to the electronic device. The circuit board 13 and the connector 131 are also fixed in the central receptacle 121 via the sustaining structure 122.

Figure 1C:
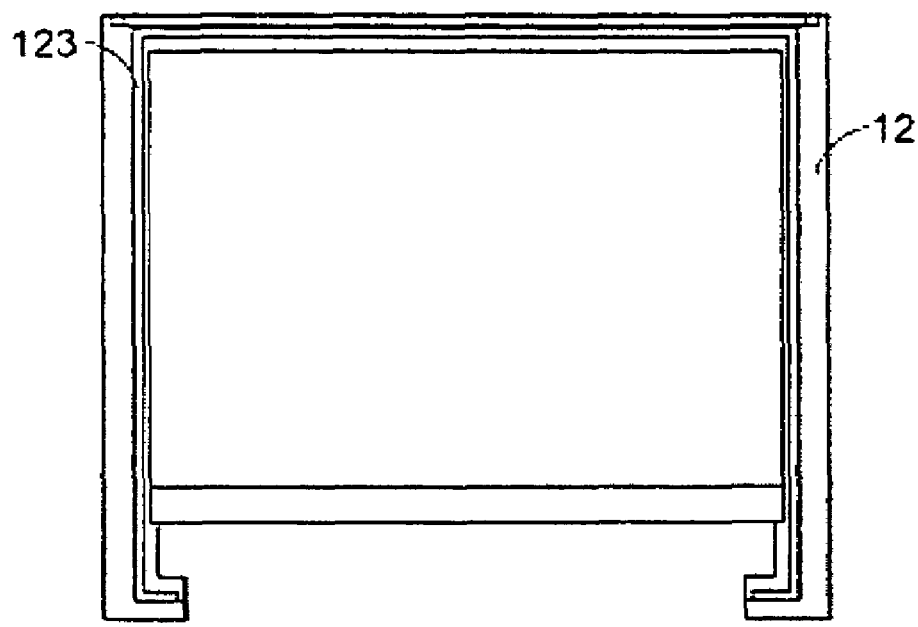
FIG. 1(c) illustrates a top view of a frame used in the packaging structure of FIG. 1(a)
Figure 1D:
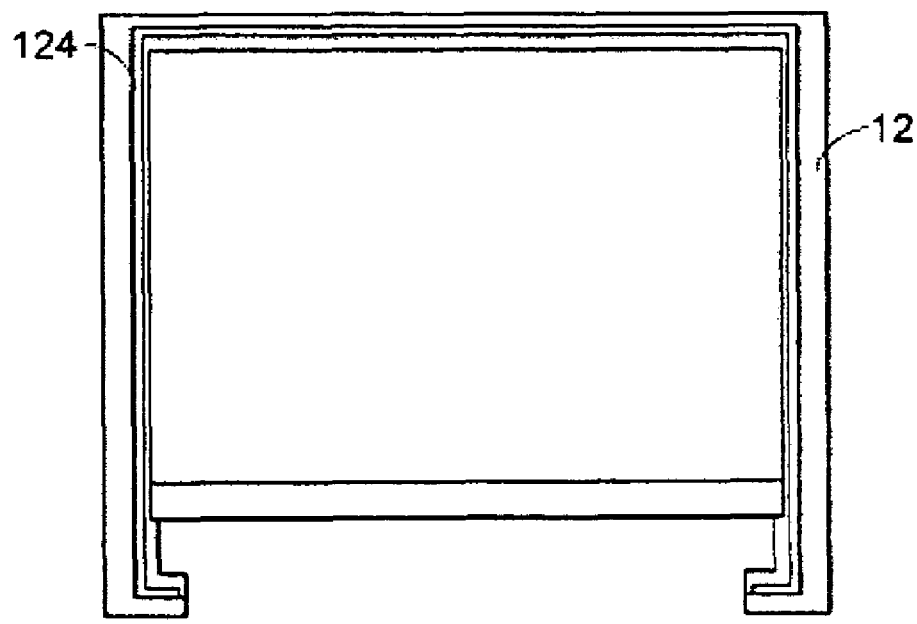
FIG. 1(d) illustrates a bottom view of a frame used in the packaging structure of FIG. 1(a)

Furthermore, as shown in FIGS. 1(a), 1(c) and 1(d), the top surface and the bottom surface of the plastic frame 12 are provided with some recesses 123 and 124, respectively, so as to enhance the engagement of the plastic frame 12 with the first metal cover 11 and the second metal cover 14.

Figure 1E:
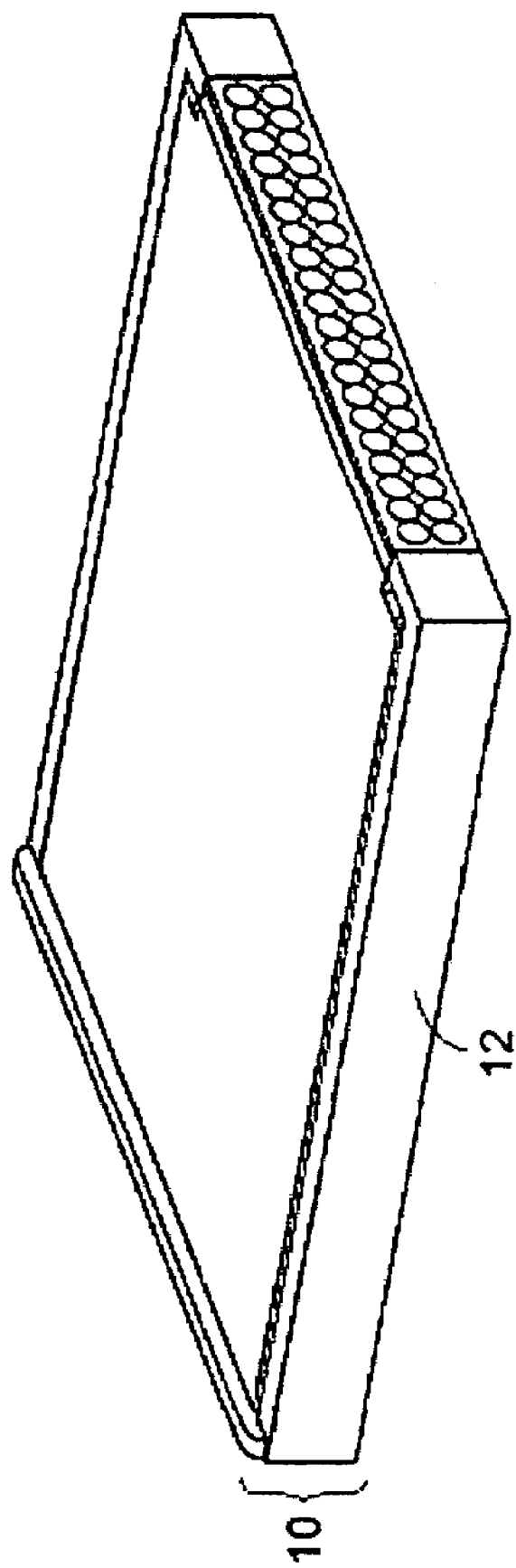
FIG. 1(e) is an assembling view illustrating packaging structure of the electronic card in FIG. 1(a)

Referring to FIG. 1(e), an assembling view illustrating packaging structure of the electronic card in FIG. 1(a) is shown. By using the ultrasonic welding technology, the metal covers 11 and 14 are fixed on the plastic frame 12 so as to form an electronic card package 10.

Figure 2:
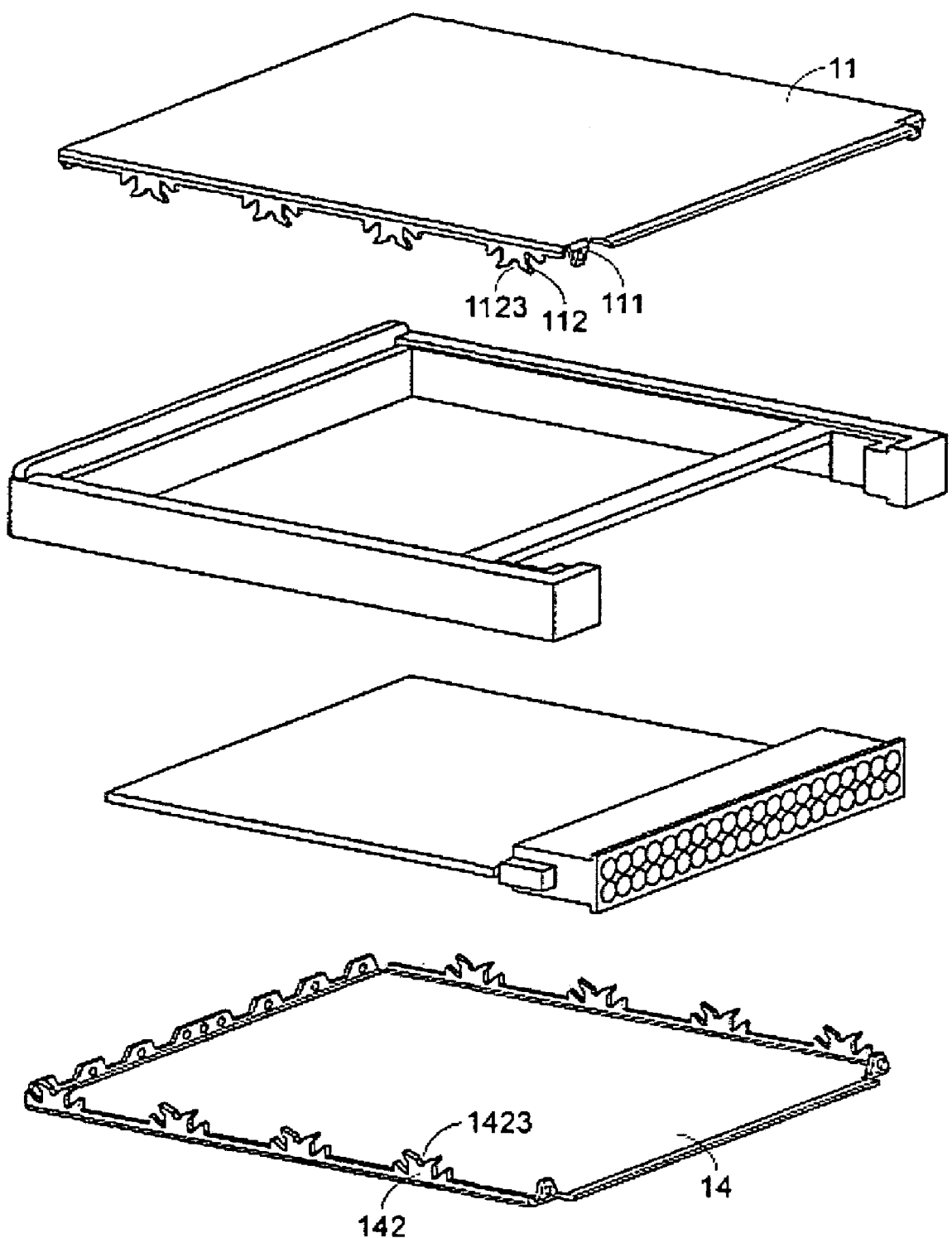
FIG. 2 is an exploded view illustrating a packaging structure of an electronic card according to a second embodiment of the present invention.

A further embodiment of an electronic card is illustrated in FIG. 2. In this embodiment, the plastic frame 12 and circuit board 13 included therein are similar to those shown in FIG. 1, and are not to be redundantly described herein. The holes 1121 of the bent pieces 112 in the FIG. 1(a) is replaced by notches 1123. Likewise, the holes 1421 of the bent pieces 142 in the FIG. 1(a) is replaced by notches 1423. The structures of the bent pieces 111 and 112 are fabricated as required, provided that the metal covers 11 and 14 are securely fixed on the plastic frame 12.

Figure 3:
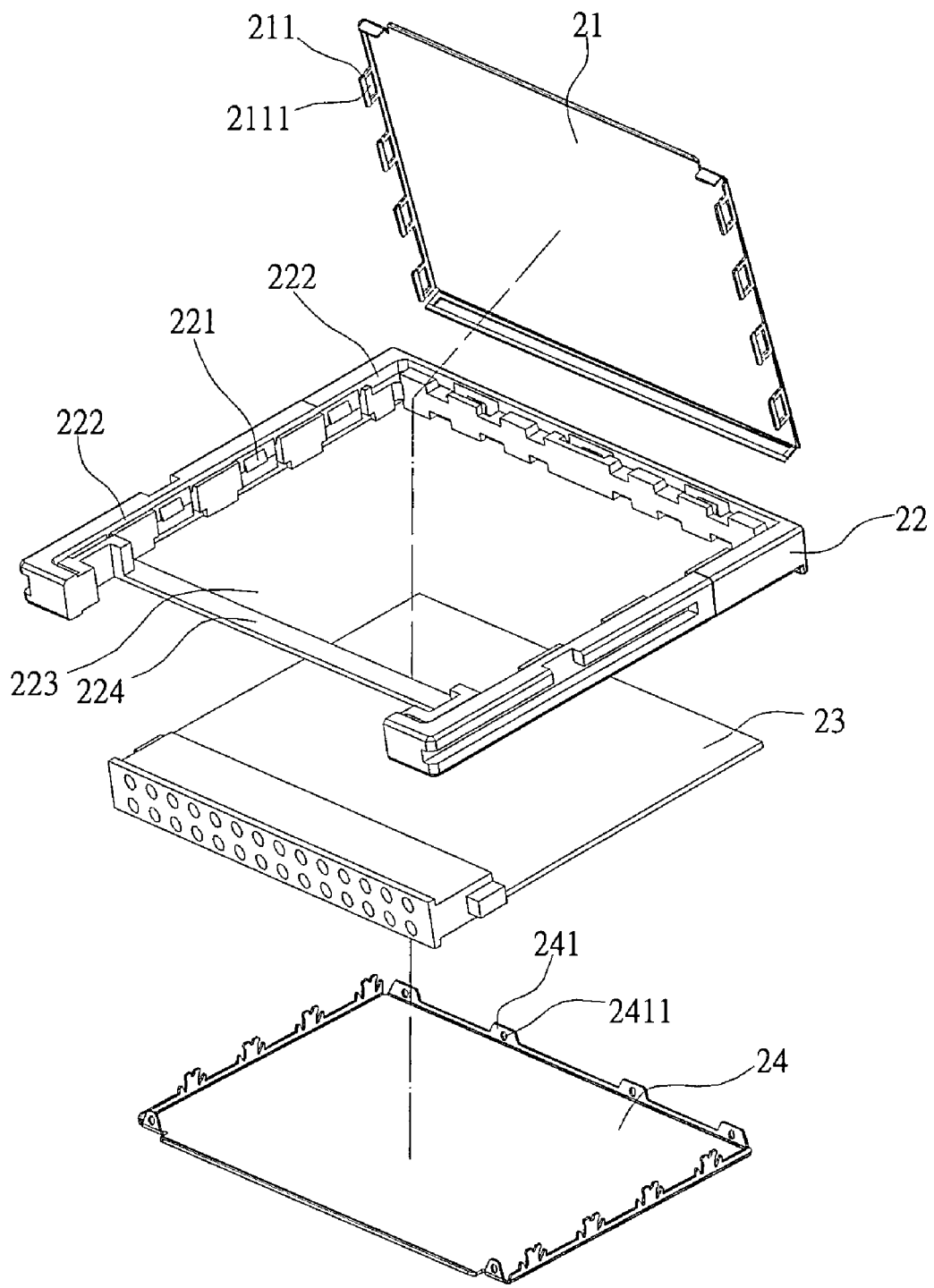
FIG. 3 is an exploded view illustrating a packaging structure of an electronic card according to a third embodiment of the present invention.

Referring to FIG. 3, an exploded view illustrating a packaging structure of an electronic card according to a third embodiment of the present invention is shown. In this embodiment, the packaging structure of the memory card comprises a first metal cover 21, a plastic frame 22, a circuit board 23 and a second metal cover 24. The first metal cover 21 has a plurality of first bent pieces 211 extending from the edges thereof, and the first bent piece 211 has an opening 2111 for receiving block 221 disposed on the inner brink surface of the plastic frame 22. The top surface and the bottom surface of the plastic frame 22 are provided with some recesses 222, respectively, so that the first metal cover 21 would be engaged with the plastic frame 22 at top surface of the plastic frame 22. The second metal cover 24 has a plurality of second bent pieces 241 extending from the edges thereof and is embedded into the bottom side of the plastic frame 22 according to an ultrasonic welding operation or a high frequency welding operation, so that the molten plastic material of the plastic frame 22 will penetrate through the holes 2411 of second bent pieces 241 to enhance the fixity between the second metal cover 24 and the plastic frame 22. Therefore, a required electronic card package is formed.

Figure 4:
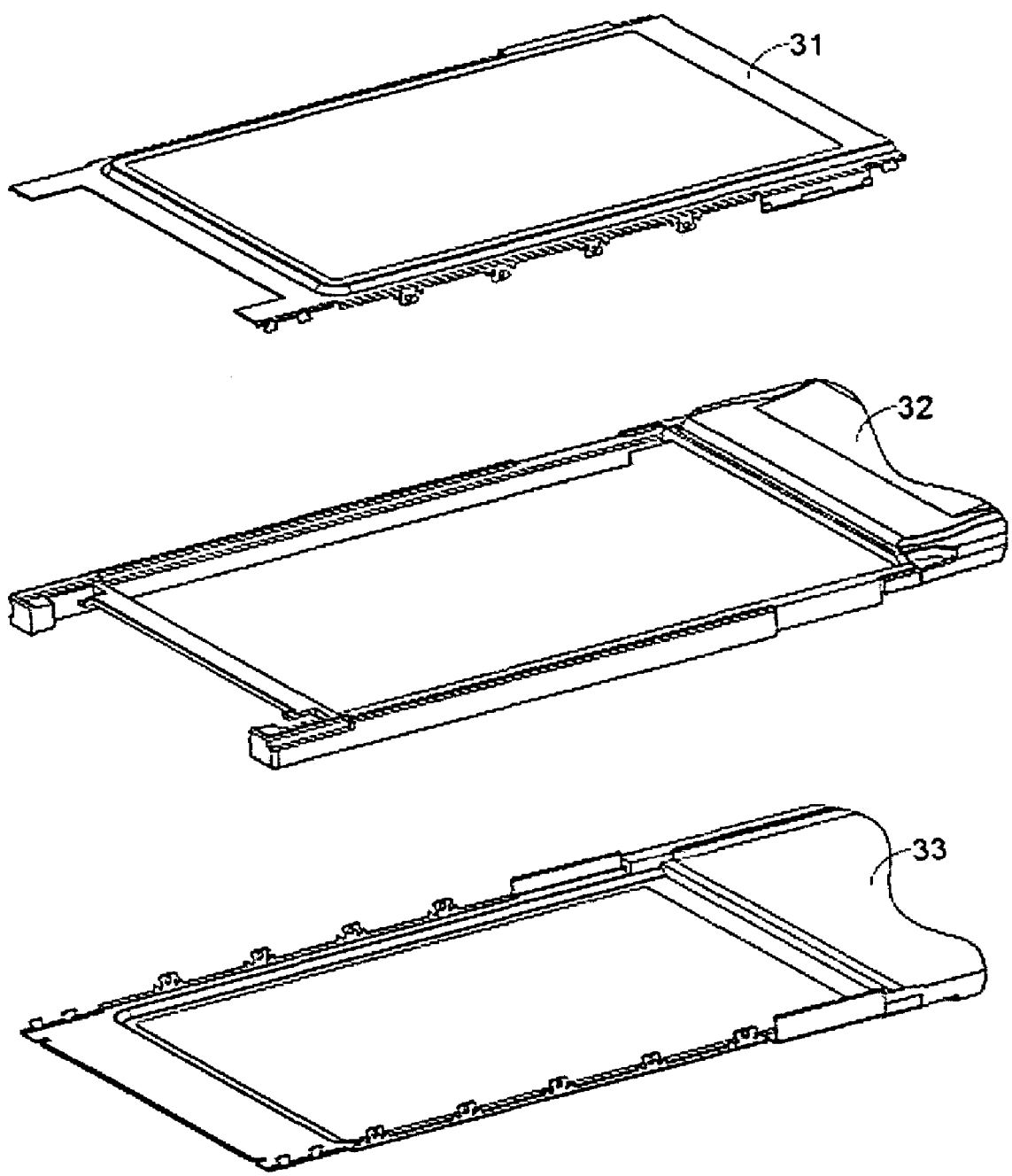
FIG. 4 is an exploded view illustrating a packaging structure of an electronic card according to a fourth embodiment of the present invention.

Referring to FIG. 4, an exploded view illustrating a packaging structure of a wireless network card according to another embodiment of the present invention is shown. In this embodiment, the packaging structure of the wireless network card comprises a first metal cover 31, a plastic frame 32 and a second metal cover 33. The bent pieces and the openings of the first metal cover 31 and the second metal cover 33 are similar to those shown in FIGS. 1 and 2, except that the plastic frame 32 has a rectangular shape.

Figure 5:
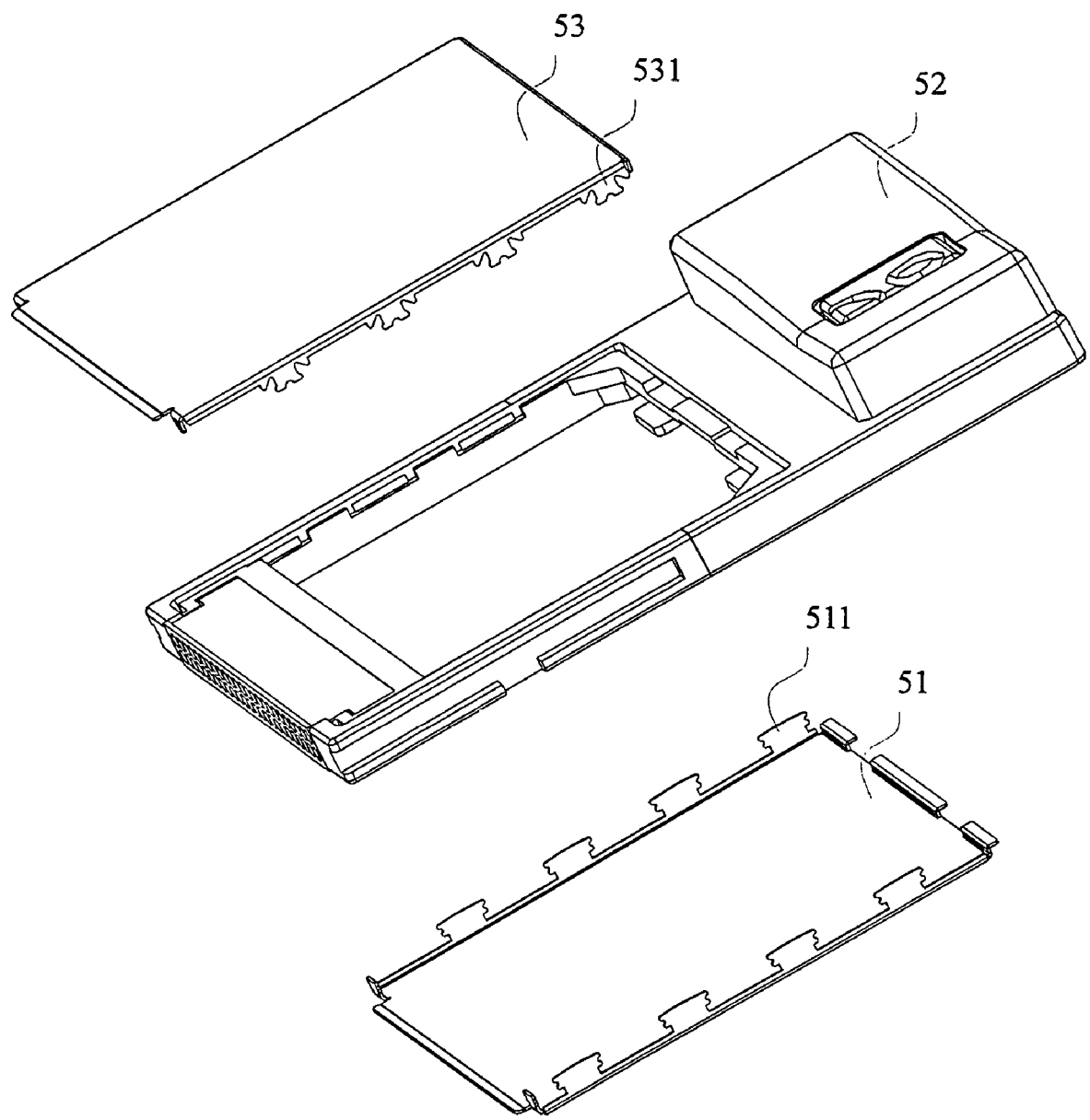
FIG. 5 is an exploded view illustrating a packaging structure of an electronic card according to a fifth embodiment of the present invention.

A further embodiment of an electronic card is illustrated in FIG. 5. In this embodiment, the packaging structure of the memory card comprises a first metal cover 51, a plastic frame 52, and a second metal cover 53. The first metal cover 51 has a plurality of first bent pieces 511 extending from the edges thereof, and the first bent piece 511 has a width substantially equal to or just bigger than the recesses (not shown) of the bottom side of the plastic frame 52 for being engaged with the plastic frame 52 firmly. The second metal cover 53 has a plurality of second bent pieces 531 extending from the edges thereof and is embedded into the top surface of the plastic frame 52 according to an ultrasonic welding operation or a high frequency welding operation, so that the molten plastic material of the plastic frame 52 will penetrate through to enhance the fixity between the second metal cover 53 and the plastic frame 52. Therefore, a required electronic card package is formed. In the other hand, an ultrasonic welding operation or a high frequency welding operation would also be performed to fix the first metal cover 51 into the plastic frame 52.

Figure 6:
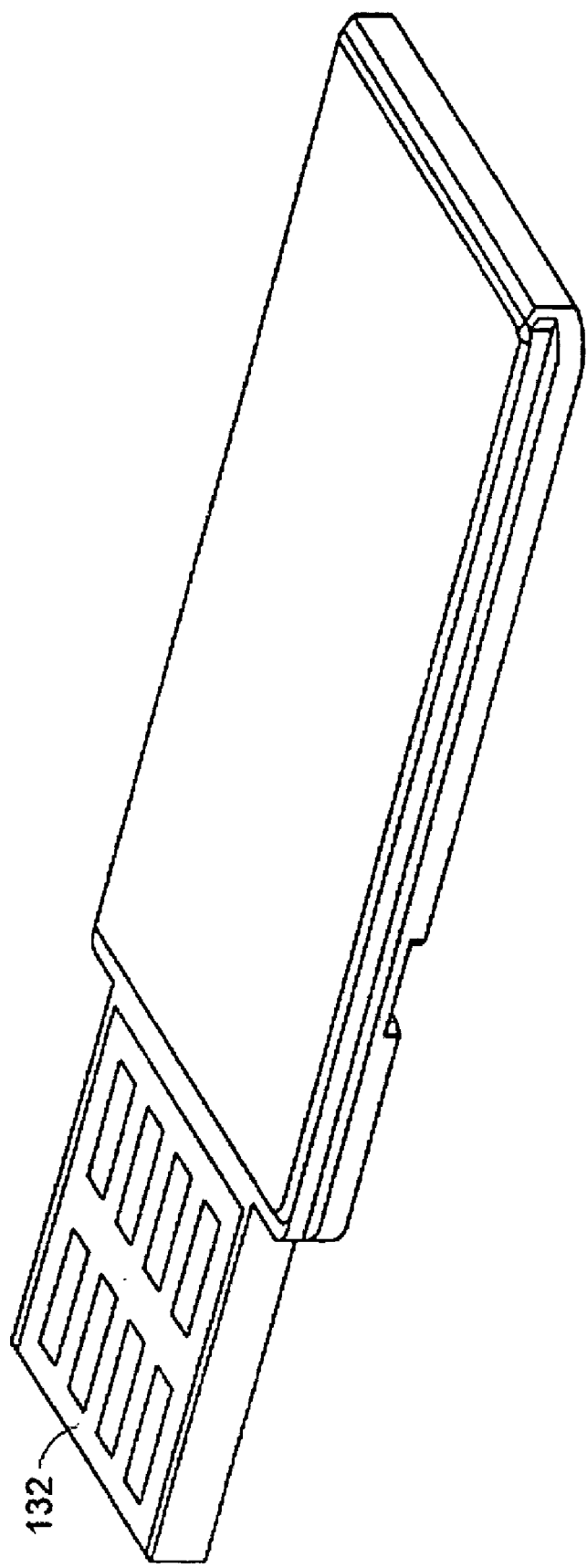
FIG. 6 is a view illustrating a packaging structure of a memory card according to the present invention.

The packaging structure of the present invention can be applied to modem cards, memory cards and wireless network cards. Referring to FIG. 6, a specific example of a memory card is shown. This memory card is commercial available from Power Quotient International Co., Ltd. Taiwan as a trade name Intelligent Stick. In this embodiment, the packaging structure of the memory card also comprises a first metal cover, a plastic frame and a second metal cover. The bent pieces and the openings of the first metal cover and the second metal cover are similar to those shown in FIGS. 1 and 2, except that the plastic frame has a rectangular shape and a connector 132 is extending outwardly from the edge of the plastic frame. By using the packaging process of the present invention, the problems occurred in the prior art are substantially overcome.

From the above description, the packaging structure of the electronic card provided by the present invention has increased fixity due to the specific structure of the metal covers as well as the use of the ultrasonic welding technology or the high frequency welding technology. In addition, the fabricating cost is largely reduced due to the elimination of developing associated molds required in the prior art.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A packaging process of an electronic card, comprising steps of:
    (a) performing a first embedding operation to embed a first metal cover into a first surface of a plastic frame by engagement or welding;
    (b) placing a circuit board on said plastic frame; and
    (c) performing a second embedding operation to embed a second metal cover into a second surface of said plastic frame by welding, thereby encapsulating said circuit board into said plastic frame so as to form an electronic card package, wherein said first metal cover, said plastic frame and said second metal cover are separately formed.

2. The packaging process according to claim 1 wherein said welding is an ultrasonic welding operation or a high frequency welding operation.

3. The packaging process according to claim 1 wherein said plastic frame comprises a sustaining structure disposed in the vicinity of the open mouth of said plastic frame.

4. The packaging process according to claim 3 wherein said sustaining structure is a horizontal bar connected to lateral sides of said plastic frame.

5. The packaging process according to claim 1 wherein said plastic frame has a rectangular shape.

6. The packaging process according to claim 1 wherein said plastic frame comprises a central receptacle for accommodating said circuit board.

7. The packaging process according to claim 1 wherein each of said first surface and said second surface of said plastic frame is provided with at least one recess for enhancing engagement of said plastic frame with said first metal cover and said second metal cover.

8. The packaging process according to claim 1 wherein each of said first metal cover and said second metal cover comprises a plurality of bent pieces extending from the edges thereof, each of said bent pieces having an opening.

9. The packaging process according to claim 8 wherein said bent pieces of said first metal cover and said second metal cover are arranged in a staggered form.

10. A packaging structure of an electronic card, comprising:
    a plastic frame;
    a first metal cover having a plurality of first bent pieces extending from the edges thereof; and
    a second metal cover having a plurality of second bent pieces extending from the edges thereof,
    wherein said first metal cover, said plastic frame and said second metal cover are separately formed, and said first metal cover and said second metal cover are embedded into the top surface and the bottom surface of said plastic frame according to a welding operation so as to form an electronic card package.

11. The packaging structure according to claim 10 wherein said welding is an ultrasonic welding operation or a high frequency welding operation.

12. The packaging structure according to claim 10 wherein said plastic frame comprises a sustaining structure disposed in the vicinity of the open mouth of said plastic frame.

13. The packaging structure according to claim 10 wherein said plastic frame comprises a central receptacle for accommodate said circuit board.

14. The packaging structure according to claim 10 wherein each of said first surface and said second surface of said plastic frame is provided with at least one recess for enhancing engagement of said plastic frame with said first metal cover and said second metal cover.

15. The packaging structure according to claim 10 wherein each of said bent pieces of said first metal cover and said second metal cover has a hole.

16. The packaging structure according to claim 10 wherein said bent pieces of said first metal cover and said second metal cover are arranged in a staggered form.

17. A packaging structure of an electronic card, comprising:

- a plastic frame having blocks disposed on an inner brink surface of said plastic frame;
- a first metal cover having a plurality of first bent pieces extending from the edges thereof, wherein each of said first bent pieces has an opening for receiving one of said blocks in one side of said plastic frame; and
- a second metal cover having a plurality of second bent pieces extending from the edges thereof,
- wherein said openings of said first metal cover receives said blocks of said plastic frame to fix said first metal cover on said side of said plastic frame and said second metal cover is embedded into another side of said plastic frame according to a welding operation so as to form an electronic card package.

18. The packaging structure according to claim 17 wherein said welding is an ultrasonic welding operation or a high frequency welding operation.

19. The packaging structure according to claim 17 wherein said first metal cover and said second metal cover is made of metal or stainless steel.

20. The packaging structure according to claim 17 wherein each of said bent pieces of said second metal cover has an opening.

* * * * *